United States Patent
Brox et al.

(10) Patent No.: US 8,846,425 B2
(45) Date of Patent: Sep. 30, 2014

(54) DIODE LASER AND METHOD FOR MANUFACTURING A HIGH-EFFICIENCY DIODE LASER

(71) Applicant: Forschungsverbund Berlin E.V., Berlin (DE)

(72) Inventors: Olaf Brox, Berlin (DE); Frank Bugge, Berlin (DE); Paul Crump, Berlin (DE); Goetz Erbert, Loebau (DE); Andre Maassdorf, Berlin (DE); Christoph M. Schultz, Berlin (DE); Hans Wenzel, Berlin (DE); Markus Weyers, Wildau (DE)

(73) Assignee: Forschungsvebund Berlin E.V., Berlin (DE)

(*) Notice: Subject to any disclaimer, the term of this patent is extended or adjusted under 35 U.S.C. 154(b) by 0 days.

(21) Appl. No.: 13/682,848

(22) Filed: Nov. 21, 2012

(65) Prior Publication Data

US 2013/0128911 A1    May 23, 2013

(30) Foreign Application Priority Data

Nov. 21, 2011   (DE) .................. 10 2011 086 744

(51) Int. Cl.
| | |
|---|---|
| H01L 33/10 | (2010.01) |
| H01S 5/187 | (2006.01) |
| H01L 33/00 | (2010.01) |
| H01S 5/12 | (2006.01) |
| H01S 5/323 | (2006.01) |

(52) U.S. Cl.
CPC ............ *H01L 33/10* (2013.01); *H01S 5/187* (2013.01); *H01L 33/005* (2013.01); *H01S 5/32316* (2013.01); *H01S 5/1231* (2013.01)
USPC .............................. 438/31; 438/29; 438/385

(58) Field of Classification Search
USPC .................... 438/82, 31, 29; 257/385
See application file for complete search history.

(56) References Cited

U.S. PATENT DOCUMENTS

| | | | |
|---|---|---|---|
| 6,195,381 B1 * | 2/2001 | Botez et al. | 372/96 |
| 6,459,715 B1 | 10/2002 | Khalfin et al. | |
| 6,461,884 B1 * | 10/2002 | Razeghi | 438/22 |
| 6,560,259 B1 | 5/2003 | Hwang | |
| 6,819,845 B2 * | 11/2004 | Lee et al. | 385/122 |
| 7,444,053 B2 * | 10/2008 | Schmidt et al. | 385/129 |

FOREIGN PATENT DOCUMENTS

DE        102009028823        2/2011

\* cited by examiner

*Primary Examiner* — Telly Green
*Assistant Examiner* — Damian A Hillman

(57) ABSTRACT

A diode laser having aluminum-containing layers and a Bragg grating for stabilizing the emission wavelength achieves an improved output/efficiency. The growth process is divided into two steps for introducing the Bragg grating, wherein a continuous aluminum-free layer and an aluminum-free mask layer are continuously deposited after the first growth process such that the aluminum-containing layer is completely covered by the continuous aluminum-free layer. Structuring is performed outside the reactor without unwanted oxidation of the aluminum-containing semiconductor layer. Subsequently, the pre-structured semiconductor surface is further etched inside the reactor and the structuring is impressed into the aluminum-containing layer. In this process, so little oxygen is inserted into the semiconductor crystal of the aluminum-containing layers in the environment of the grating that output and efficiency of a diode laser are not reduced as compared to a diode laser without grating layers that was produced in an epitaxy step.

14 Claims, 3 Drawing Sheets

DIODE LASER AND METHOD FOR MANUFACTURING A HIGH-EFFICIENCY DIODE LASER

RELATED APPLICATION

This application claims the benefit of priority of German Patent Application No. 10 2011 086 744.9 filed on Nov. 21, 2011, the contents of which are incorporated herein by reference in their entirety.

DESCRIPTION

This invention relates to a high-efficiency diode laser and a method for its manufacture.

PRIOR ART

GaAs-based broad area laser diodes achieve high outputs >5 W at a good efficiency >60% but have a spectral bandwidth ≥2 nm and relatively high sensitivity to temperature >0.3 nm/K. However, applications such as pumping solid-state lasers with narrow absorption bands require a higher stability of the emission wavelength.

The emission wavelength can be stabilized by integrating a Bragg grating into the laser. A spectral bandwidth <1 nm and improved sensitivity to temperature <0.1 nm/K can be achieved in this way.

The use of Bragg gratings in diode lasers is known, for example, from DE 10 2009 028 823 A1, U.S. Pat. No. 6,459,715 B1, and U.S. Pat. No. 6,560,259 B1.

Use of aluminum-containing materials (e.g. AlGaAs as a semiconductive aluminum-containing material) is advantageous for laser designs at an emission wavelength in the range from 600 nm to 1600 nm. But epitaxial overgrowth of such materials is a problem. The exposed (aluminum-containing) semiconductor surface is oxidized by preparing a Bragg grating outside the epitaxy reactor (e.g. in air). Unlike gallium oxide, for example, aluminum oxide can then no longer be thermally desorbed or removed in another efficient manner. This results in defect-ridden crystal growth of the following layers. At the same time, the defect propagation rate is particularly high in aluminum-containing layers, which means that inbuilt defects can be far-reaching.

Implementation of a Bragg grating for stabilizing the emission wavelength in conventional laser diodes with aluminum-containing layers entails the disadvantage of a considerable reduction in output or efficiency, respectively.

DISCLOSURE OF THE INVENTION

It is therefore an object of this invention to describe a diode laser having aluminum-containing layers and a Bragg grating implemented for stabilizing the emission wavelength and comprising a higher output and/or efficiency as compared to conventional laser diodes with a monolithically integrated Bragg grating. Another object of this invention is a method for implementing a Bragg grating in an aluminum-containing layer which, unlike conventional methods, results in minor oxygen atom insertion only into the semiconductor crystal of the aluminum-containing layer.

These objects are achieved, according to the invention, by the characteristics listed in claim 1. Useful embodiments of the invention are described in the dependent claims.

The idea of this invention is to divide the growth process into two steps for introducing the Bragg grating, wherein a continuous aluminum-free layer and an aluminum-free mask layer are deposited in a first growth process such that the aluminum-containing layer is completely covered by the continuous aluminum-free layer. The mask layer can thus be structured outside the reactor without undesirable oxidation of the aluminum-containing layer.

Etching inside a reactor causes the structuring of the mask layer to be impressed into the aluminum-free layer or into the aluminum-free layer and the aluminum-containing layer beneath it to form a Bragg grating. A second, preferably aluminum-containing layer is epitaxially grown on top thereof.

The method according to the invention for manufacturing a diode laser includes the following process steps: Formation of a first cladding layer, a first waveguide layer, an active layer, a second waveguide layer, and a second cladding layer, wherein at least one layer selected from the group of first cladding layer, first waveguide layer, second waveguide layer, and second cladding layer comprises a first aluminum-containing layer; and formation of a Bragg grating on or within the first aluminum-containing layer, wherein the formation of the Bragg grating includes the following steps:

a) In a reactor, a continuous aluminum-free layer is deposited onto the first aluminum-containing layer and then a continuous aluminum-free mask layer is deposited onto the aluminum-free layer such that the first aluminum-containing layer is completely covered by the continuous aluminum-free layer;

b) a resist mask is deposited onto the continuous mask layer and structured (outside the reactor), and then the continuous mask layer is structured by etching (outside the reactor) such that the mask layer corresponds or largely corresponds to the structure of the resist mask, the aluminum-free layer is at least partially exposed, and the aluminum-containing layer is completely covered by the aluminum-free layer;

c) subsequently, the aluminum-free layer is etched in a reactor using the structured mask layer as an etch mask, such that the aluminum-free layer comprises a grid structure without exposing the first aluminum-containing layer (first, preferred embodiment), or the first aluminum-containing layer is exposed between the grid webs of the aluminum-free layer (second, particularly preferred embodiment), or etching is performed until the grid structure is impressed into the first aluminum-containing layer itself (third, preferred embodiment); and d) subsequently, a second, (preferably) aluminum-containing layer is deposited in a reactor.

It is preferred that the continuous aluminum-containing layer is epitaxially grown inside a reactor in step a).

It is preferred that process step b) is performed outside the reactor used in process step a).

It is preferred that the same reactor is used for process steps a), c), and d).

It is preferred that the partial pressure of oxygen inside the reactor during process steps a), c), and d) is smaller than $5*10^{-6}$ Pa, more preferably smaller than $1*10^{-7}$ Pa.

It is preferred that the partial pressure of oxygen while performing process step b) (preferably in ambient air, 20° C.) is greater than $5*10^{-6}$ Pa, more preferably greater than $5*10^{-5}$ Pa.

It is preferred that the resist mask is structured such that it corresponds or largely corresponds to the structure of the Bragg grating to be formed.

It is preferred that, before performing process step d), the aluminum-free layer is structured in the reactor using a corrosive gaseous medium (such as $CBr_4$, $CCl_4$ or the like) such that partial areas of the aluminum-containing layer are exposed by the aluminum-free layer.

It is preferred that, before performing process step d), the aluminum-free layer is structured such that partial areas of the aluminum-containing layer are exposed by the aluminum-free layer.

It is preferred that, before performing process step d), the mask layer is completely etched away in the reactor using a corrosive gaseous medium.

It is preferred that, before performing process step d), the aluminum-free layer is completely etched away in the exposed areas.

It is preferred that, before performing process step d), the aluminum-free layer is completely etched away (for the third, preferred embodiment).

The aluminum-free mask layer and the aluminum-free layer may also consist of several partial layers, each of which being aluminum-free, or they can form a joint layer, which may under specific conditions be advantageous for the technological manufacture of the grid structure, for example, because it allows the use of selective etching processes.

It is preferred that gallium arsenide or gallium arsenide phosphide is used as the aluminum-free mask layer. It is preferred that a compound semiconductor material that may consist of the elements indium, gallium, phosphorus, arsenic, antimony, and nitrogen, for example, gallium arsenide, gallium indium phosphide, or gallium arsenide phosphide, is used as the aluminum-free layer.

It is preferred that the same reactor is used for process steps a), c), and d).

The diode laser according to the invention includes: a first (preferably n-type conducting) cladding layer, a first (preferably n-type conducting) waveguide layer that is positioned on the first cladding layer, an active layer that is suitable for generating radiation and positioned on the first waveguide layer, a second (preferably p-type conducting) waveguide layer that is positioned on the active layer, and a second (preferably p-type conducting) cladding layer that is positioned on the second waveguide layer, and a Bragg grating, wherein at least one layer selected from the group of first cladding layer, first waveguide layer, second waveguide layer, and second cladding layer is aluminum-containing; and wherein the Bragg grating is formed on or inside the at least one aluminum-containing layer, the interface between the Bragg grating and the at least one aluminum-containing layer comprising an oxygen concentration smaller than 1% ($<10^{19}$ $cm^{-3}$), more preferably smaller than 0.1% ($<10^{19}$ $cm^{-3}$), and even more preferably smaller than 0.01% ($<10^{17}$ $cm^{-3}$). It is preferred that the thickness of the interface is up to 50 nm.

It is preferred that the aluminum content of the first aluminum-containing layer differs from the aluminum content of the second aluminum-containing layer deposited in process step d). In an alternative preferred embodiment, the aluminum content of the first aluminum-containing layer matches the aluminum content of the second aluminum-containing layer deposited in process step d).

An aluminum-free layer in the meaning of this invention preferably is a layer with an aluminum content of less than 3% (in relation to the volume), more preferably less than 1%, and even more preferably less than 0.1%. An aluminum-containing layer in the meaning of this invention preferably is a layer with an aluminum content of more than 3% (in relation to the volume), more preferably more than 5%, and even more preferably more than 10%.

According to a second aspect, the idea of this invention is that an aluminum-containing layer is structured by dividing the growth process into two steps, wherein a continuous aluminum-free layer and an aluminum-free mask layer are continuously deposited (onto an unstructured aluminum-containing layer) after the first growth process such that the aluminum-containing layer is completely covered by the continuous aluminum-free layer. Structuring (the mask layer) can thus be performed outside a reactor without undesirable oxidation of the (otherwise) exposed aluminum-containing semiconductor surface. Further structuring of the continuous aluminum-free layer and thus the aluminum-containing layer is once again performed inside a reactor at a sufficiently low partial oxygen pressure.

The method according to the invention for manufacturing a structured diode laser includes the following process steps:
e) Provision of a continuous aluminum-containing layer;
f) in a reactor, a continuous aluminum-free layer is deposited onto the aluminum-containing layer, and then a continuous aluminum-free mask layer is deposited onto the aluminum-free layer such that the aluminum-containing layer is completely covered by the continuous aluminum-free layer;
g) a resist mask is then deposited onto the continuous mask layer and structured, and then the continuous mask layer is structured by etching such that the mask layer corresponds or largely corresponds to the structure of the resist mask, the aluminum-free layer is at least partially exposed, and the aluminum-containing layer is completely covered by the aluminum-free layer;
h) the aluminum-free layer is then structured in a reactor by etching the structured mask layer, such that the aluminum-free layer comprises a grid structure; and
i) subsequently, a second, preferably aluminum-containing layer is deposited in a reactor.

It is preferred that the continuous aluminum-containing layer in step e) is epitaxially grown inside a reactor.

It is preferred that process step g) is performed outside the reactor used in process step f). It is preferred that the partial pressure of oxygen inside the reactor during process steps e), f), h), and i) is smaller than $5*10^{-6}$ Pa, more preferably smaller than $1*10^{-7}$ Pa. It is preferred that the partial pressure of oxygen while performing process step g) is greater than $5*10^{-6}$ Pa, more preferably greater than $5*10^{-5}$ Pa.

It is preferred that, before performing process step i), the aluminum-free layer is structured such that partial areas of the aluminum-containing layer are exposed by the aluminum-free layer.

It is preferred that the mask layer is completely etched away before performing process step i). It is preferred that the aluminum-free layer is completely etched away before performing process step i).

The aluminum-free mask layer and the aluminum-free layer may also consist of several partial layers, each of which being aluminum-free, or they can form a joint layer, which may under specific conditions be advantageous for the technological manufacture of the grid structure, for example, because it allows the use of selective etching processes.

It is preferred that a compound semiconductor material that may consist of the elements indium, gallium, phosphorus, arsenic, antimony, and nitrogen, for example, gallium arsenide, gallium indium phosphide, or gallium arsenide phosphide, is used as the aluminum-free layer. It is preferred that the same reactor is used for process steps e), f), h), and i).

BRIEF DESCRIPTION OF THE DRAWINGS

The invention is described in greater detail based on exemplary embodiments thereof below, wherein.

DETAILED DESCRIPTION OF THE DRAWINGS

Figure 1:
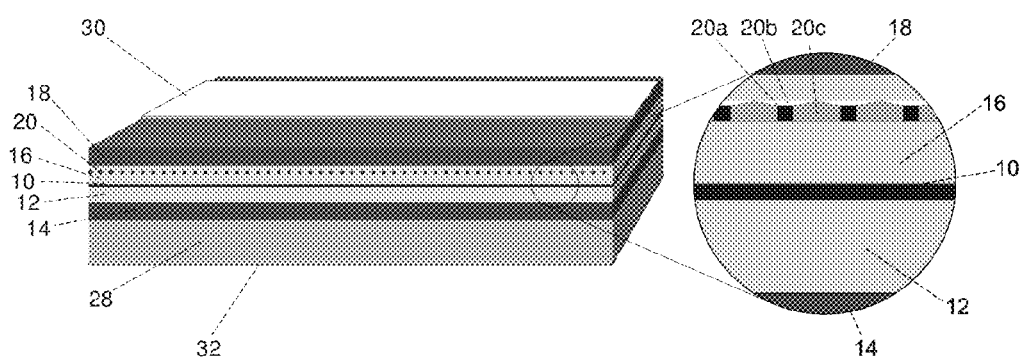
FIG. 1 is a diagrammatic perspective view of a first embodiment of a laser diode according to the invention.
Figure 2:
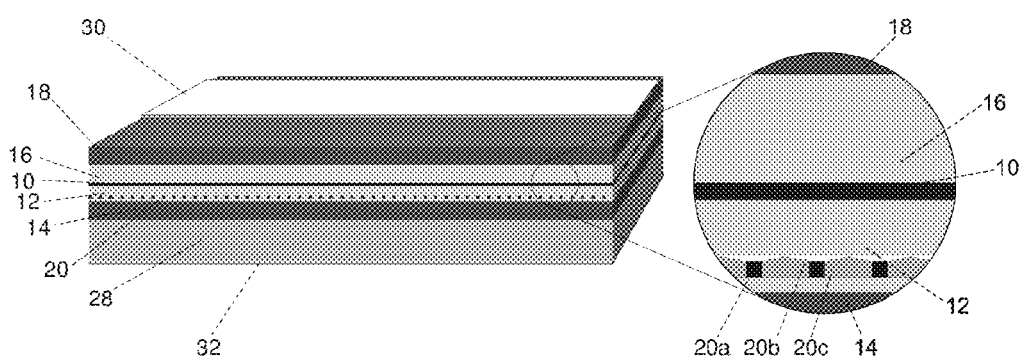
FIG. 2 is a diagrammatic perspective view of a second embodiment of a laser diode according to the invention.

FIGS. 1 and 2 show a diagrammatic perspective view of an exemplary laser diode according to the invention.

The laser diode according to the invention comprises a vertical layer structure with a substrate 28, a first n-type conductive cladding layer 14 positioned thereon, a first n-type conductive waveguide layer 12 positioned thereon, an active layer 10 positioned thereon, a second, p-type conductive waveguide layer 16 positioned thereon, and a second, p-type conductive cladding layer 18 positioned thereon.

Furthermore, the laser diode preferably comprises contacts 30 and 32 for injecting charge carriers. The structure formed in this way lets charge carriers of a first polarity reach the active layer 10 via the first contact 32, the first (here preferably n-type) cladding layer 14 and the first (here preferably n-type) waveguide layer 12, and lets charge carriers of the opposite polarity reach the active layer 10 as well via the second contact 32, the second (here preferably p-type) cladding layer 18 and the second (here preferably p-type) waveguide layer 16, respectively, and recombine there, which causes the emission of light.

A Bragg grating 20 is integrated into the laser using a two-step epitaxial process to stabilize the emission wavelength. The Bragg grating 20 can either be integrated in the p-type (second) waveguide layer 16 (FIG. 1) or in the n-type (first) waveguide layer 12 (FIG. 2). However, the position of the Bragg grating 20 is not limited to the embodiments shown in FIGS. 1 and 2. Alternatively, the Bragg grating 20 can be integrated into one of the cladding layers or at one of the interfaces between cladding layer and waveguide layer. It would even be conceivable to position the Bragg grating 20 in the outer edge area of the cladding layers (facing the contacts).

Furthermore, the laser diode preferably comprises passivated facets (not shown here) on its lateral opposite ends comprising reflectivities that can be individually adjusted by coating with thin dielectric layers and adapted to the respective operation of the laser. The feedback of the light propagating along the waveguide that is required for laser operation is produced by the effect of the grating and the facets.

Since the use of aluminum-containing materials (e.g. AlGaAs as a semiconductive aluminum-containing material) is advantageous for laser designs at an emission wavelength in the range from 600 nm to 1600 nm, it is desirable that the Bragg grating 20 be formed inside or on an aluminum-containing layer (waveguide layer or cladding layer) but without oxidizing the aluminum-containing semiconductor surface, because this would entail a reduction in output due to defect-ridden crystal growth of the subsequent layers. Naturally, the Bragg grating 20 may also be positioned between two layers, wherein at least one of these layers is an aluminum-containing layer.

As FIGS. 1 and 2 show, the Bragg grating 20 that is integrated into one of the waveguide layers (12 or 16, respectively) comprises, in a preferred embodiment, a grating web 20a (from an aluminum-free material), a region 20b with increased aluminum content in the vicinity of the grating webs 20a, and a region 20c with reduced aluminum content between the grating webs 20a.

Since the growth process of the aluminum-containing layer of the Bragg grating 20 is divided into two steps according to the invention, oxidation of the interface between the Bragg grating (which may include an aluminum-containing layer as well) and the at least one aluminum-containing layer (of the laser diode, such as the waveguide layer) can be avoided, such that the oxygen concentration in the interface region preferably is smaller than $10^{17}$ cm$^{-3}$. Although the emission wavelength is stabilized (because of the Bragg grating), this does not result in reduced output or efficiency.

Figure 3:
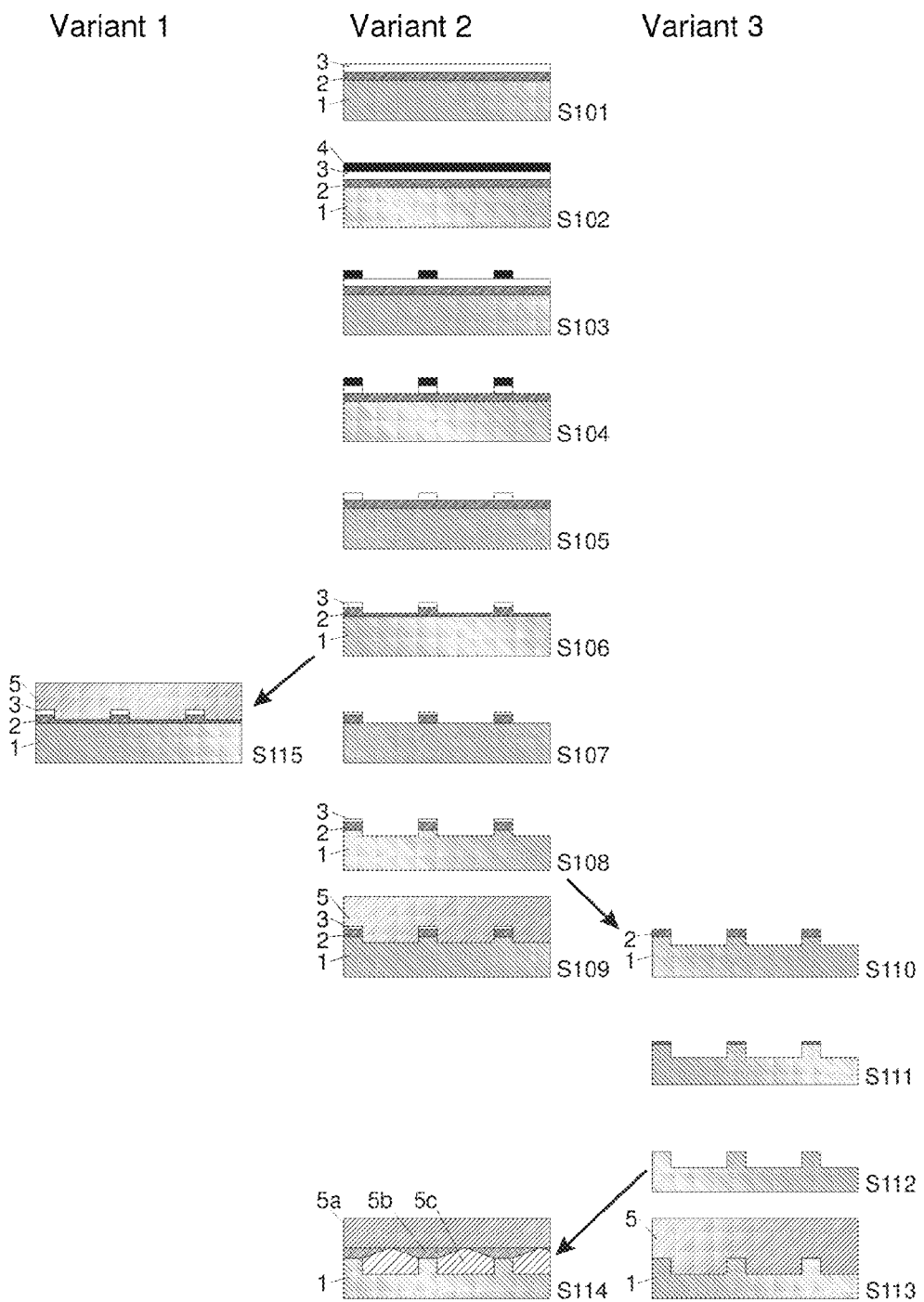
FIG. 3 shows the individual steps of the method of the invention for manufacturing a Bragg grating in the laser diode of the invention according to a first, second, and third preferred embodiment.

FIG. 3 shows the individual process steps of a multitude of preferred embodiments for the manufacture of a laser diode with an integrated Bragg grating according to the invention.

First, an aluminum-containing layer is provided that, according to a preferred embodiment, is part of a diode laser. However, this invention is not limited to the use of a diode laser. Instead, an aluminum-containing layer structured using the method of the invention can be used in other components that are produced and function based on similar technologies.

To illustrate the present invention, layer 1 in FIG. 3 corresponds to the waveguide layer 16 in FIG. 1 or the waveguide layer 12 in FIG. 2.

For integrating a Bragg grating 20 according to the invention, an aluminum-containing layer 1 is epitaxially grown in a reactor and deposited onto a continuous aluminum-free layer 2 that will protect the aluminum-containing layer 1 from oxidation in a later process step (step S103) performed outside the reactor. In addition, an aluminum-free mask layer 3 is deposited onto the continuous aluminum-free layer 2 (step S101). Then the pile of layers 1, 2, 3 is removed from the reactor (not shown here), and a resist mask 4 is deposited onto the continuous mask layer 3 (step S102). Then the resist mask 4 is structured using conventional techniques; the structure of the resist mask 4 corresponds to the later structure or later inverse structure, respectively, of the Bragg grating 20 (step S103). For example, the photosensitive resist layer 4 is exposed to a periodic line structure. Then the photosensitive coat 4 is developed and used as an etching mask for etching the top aluminum-free layer 3.

Then the aluminum-free mask layer 3 is structured (etched) using the resist mask 4, and the structure of the mask layer 3 corresponds or largely corresponds to the structure of the resist mask 4 (step S104). Depending on the materials selected, the webs of the structured mask layer 3 produced by etching can be wider or narrower (underetching) in width than the webs of the resist mask 4. However, the positions of the webs of the structured mask layer 3 correspond to the positions of the webs of the resist mask 4.

Then the resist mask 4 is removed (step S105). The pile of layers 1, 2, 3 (with the structured mask layer that comprises periodic webs) obtained in step S105 is then transferred into a reactor.

Presence of the lower aluminum-free layer 2 is advantageous for impressing the corrugated surface into the lower aluminum-containing layer 1. This is necessary because of the requirement to protect the lower aluminum-containing layer 1 from atmospheric oxygen and from the preferably selective etching of the upper aluminum-free layer 3 that stops on the lower aluminum-free layer 2.

Subsequently, the aluminum-free layer 2 is etched in the reactor (step S106). According to the first preferred embodiment (Variant 1), it is not required to etch the aluminum-free layer 2 such that the aluminum-containing layer 1 is exposed. It is sufficient for producing a Bragg grating 20 to reduce the aluminum-free layer 2 down to a specific thickness such that a tiered aluminum-free layer 2 is obtained as a result of the webs of the mask layer 3, i.e. the aluminum-free layer 2 comprises a periodic structure of webs (greater thickness in the region of the webs of mask layer 3) and grooves (smaller thickness in the areas between the webs of mask layer 3)—like the pile of layers 1, 2, 3 shown in step S106. It is then possible according to the first preferred embodiment (Variant 1) to deposit another preferably aluminum-containing layer 5 onto this periodically structured aluminum-free layer 2.

The effect of the Bragg grating is produced because the effective refractive index of a cross-section through a grid web differs from the effective refractive index of a cross-section between two grid webs. Consequently, the effective refractive index is periodically modulated in the longitudinal direction of light propagation.

If layer 5 is aluminum-containing, the aluminum content may furthermore vary in the regions between and above webs during the epitaxial growth process due to the structure of the underlying layers 2, 3, such that the aluminum-containing layer 5 comprises a periodical structure of high aluminum content (in the areas of the webs of mask layer 3—see also 20b in FIGS. 1 and 2) and low aluminum content (in the areas between the webs of mask layer 3—see also 20c in FIGS. 1 and 2) (not shown in step S115). The periodical variation of the aluminum content is accompanied by an additional periodical variation of the refraction index, which can strengthen (preferred) or weaken the effect of the Bragg grating. The Bragg grating resulting from at least one of the effects mentioned causes spectral stabilization of the emission wavelength of the laser diode. In Variant 1, a portion of mask layer 3 may remain in the Bragg grating 20.

It is possible to impress the corrugated surface of layer 3 just into the lower aluminum-free layer 2 such that a thin, continuous aluminum-free layer 2 covers the lower aluminum-containing layer 1. DFB-BA lasers manufactured in this way indeed achieve very high outputs (≈11 W) and conversion efficiencies (≈58%). The continuous aluminum-free layer 2 only causes the series resistance to be somewhat higher than in lasers in which the layer 2 is removed between grid webs (Variants 2 and 3).

According to a second preferred embodiment (Variant 2), the aluminum-free layer 2 is etched in the reactor almost under exclusion of oxygen to prevent oxidation of the surface, such that the aluminum-containing layer 1 is exposed (step S107). The etching attack can be completed according to Variant 2 if the aluminum-containing layer 1 is exposed between the grid webs consisting of the aluminum-free layers 2 and 3 (step 107), or the etching attack can be continued beyond the interface between layers 2 and 1 (step 108). Then once again another preferably aluminum-containing layer 5 can be added by epitaxial growth (step 109).

Like in Variant 1, the effect of the Bragg grating is produced because the effective refractive index of a cross-section through a grid web differs from the effective refractive index of a cross-section between two grid webs (hereinafter also referred to as effect 1). If layer 5 is aluminum-containing, the aluminum content may furthermore vary in the regions between and above webs during the epitaxial growth process due to the structure of the underlying layers 2, 3, such that the aluminum-containing layer 5 comprises a periodical structure of high aluminum content (in the areas of the webs of mask layer 3—see also 20b in FIGS. 1 and 2) and low aluminum content (in the areas between the webs of mask layer 3—see also 20c in FIGS. 1 and 2) (not shown in step S109) (hereinafter also referred to as effect 2). The periodical variation of the aluminum content is accompanied by an additional periodical variation of the refraction index, which can strengthen (preferred) or weaken the effect of the Bragg grating. The Bragg grating resulting from at least one of the effects mentioned causes spectral stabilization of the emission wavelength of the laser diode.

According to another preferred embodiment (Variant 3), the aluminum-free layer 1 is etched even further in the reactor, almost under exclusion of oxygen to prevent oxidation of the surface, such that the mask layer 3 is completely etched away (step 110), the webs/grooves of the aluminum-containing layer 1 become even deeper (step 111), or even the aluminum-free layer 2 is completely etched away (step S112). Then once again another preferably aluminum-containing layer 5 can be added by epitaxial growth after each one of steps S110, S111, or S112.

The effect of the Bragg grating is produced because the effective refractive index of a cross-section through a grid web differs from the effective refractive index of a cross-section between two grid webs (effect 1). If layer 5 is aluminum-containing, the aluminum content may furthermore vary in the regions between and above webs during the epitaxial growth process due to the structure of the underlying layers 2, 3, such that the aluminum-containing layer 5 comprises a periodical structure of high aluminum content (in the areas of the webs of mask layer 3—see also 20b in FIGS. 1 and 2) and low aluminum content (in the areas between the webs of mask layer 3—see also 20c in FIGS. 1 and 2) (shown in step S114) (effect 2). The periodical variation of the aluminum content is accompanied by an additional periodical variation of the refraction index, which can strengthen (preferred) or weaken the effect of the Bragg grating. The Bragg grating resulting from both effects causes spectral stabilization of the emission wavelength of the laser diode. The aluminum content of layer 5 can be selected such that it corresponds or largely corresponds to the aluminum content of layer 1 (deviation preferably less than 5%). The effect of the Bragg grating is in this case brought about by the formation of regions 5a with unchanged aluminum content, regions 5b with increased aluminum content, and regions 5c with reduced aluminum content (step 114).

It is however possible that layer 5 has an aluminum content that differs from that of layer 1 (step 113), which produces a Bragg grating effect even if only effect 1 contributes and effect 2 does not.

According to the invention (as explained above), there is not necessarily just one separate grating layer 20; rather, a multitude of layers may contribute to the grating effect. It depends on the production which layers these are (see Variants 1, 2, and 3 in the figure).

A Bragg grating 20 is defined as a periodical modulation of the complex refractive index in the longitudinal direction of light propagation.

The effect of the Bragg grating 20 as an optical grating results from the contrast of the effective refractive index between cross-section planes that results in Bragg scattering and constructive interference of the scattered portions of light, which meet the Bragg condition of the first or a higher order (for higher-order Bragg gratings).

In laser diodes shown in FIG. 3 and manufactured using the method according to the invention, oxidation of the interface between the Bragg grating 20 and the at least one aluminum-containing layer (12, 14, 16, or 18) can advantageously be avoided. The oxygen concentration in the interface region is therefore preferably smaller than 0.01% or $<10^{17}$ cm$^{-3}$, respectively.

Figure 4:
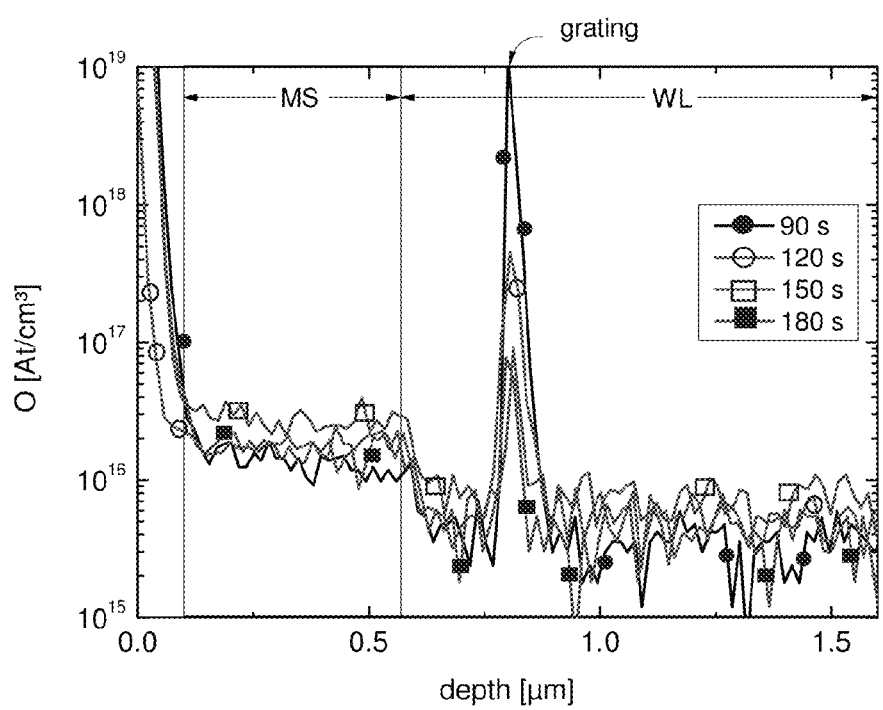
FIG. 4 shows the correlation between etching time and oxygen content in the interface between the Bragg grating and the (at least one aluminum-containing) waveguide layer.

It is preferred that the density of the oxygen atoms in the semiconductor material is less than $10^{19}$ cm$^{-3}$, particularly preferred less than $10^{18}$ cm$^{-3}$ and even more preferably less than $10^{17}$ cm$^{-3}$. The influence of etching time (steps 104 to 112) on oxygen content is shown in FIG. 4, wherein MS represents the cladding layer 14 or 18, respectively, and WL represents the waveguide layer 12 or 16, respectively. Before etching, the grating shown consists of a (selectively etched through) 25 nm structured mask layer made of gallium arsenide and a 20 nm aluminum-free layer made of gallium indium phosphide. It has turned out that the conversion efficiency of a laser diode manufactured using the method of the invention and having an oxygen content greater than $10^{18}$ cm$^{-3}$ is smaller than 50% at the interface between the first and second growth processes (total etching time <100 s). Furthermore, the conversion efficiency of a laser diode manufactured using the method of the invention and having an oxygen content smaller than $10^{18}$ cm$^{-3}$ (total etching time of 120 s) is approximately 58%, and the conversion efficiency of a laser diode manufactured using the method of the invention and having an oxygen content smaller than $10^{17}$ cm$^{-3}$ (total etching time of more than 140 s) is more than 60%. According to the invention, it is therefore particularly preferred to select a total etching time of more than 140 s for this reactor type.

What is claimed is:

1. A method for manufacturing a diode laser comprising:
    forming a first cladding layer, a first waveguide layer, an active layer, a second waveguide layer, and a second cladding layer, wherein at least one layer selected from the group of first cladding layer, first waveguide layer, second waveguide layer, and second cladding layer comprises a first aluminum-containing layer; and
    forming a Bragg grating on or within the first aluminum-containing layer, wherein the formation of the Bragg grating comprises in this order:
    (a) in a reactor, depositing a continuous aluminum-free layer onto the first aluminum-containing layer and then depositing a continuous aluminum-free mask layer onto the aluminum-free layer such that the first aluminum-containing layer is completely covered by the continuous aluminum-free layer;
    (b) depositing and structuring a resist mask onto the continuous mask layer, and then structuring the continuous mask layer by etching such that the mask layer corresponds or largely corresponds to the structure of the resist mask, the aluminum-free layer is at least partially exposed, and the aluminum-containing layer is completely covered by the aluminum-free layer;
    (c) subsequently structuring the aluminum-free layer in one member of the group consisting of the same and another reactor by impressing the structured mask layer using a gaseous etching medium such that the aluminum-free layer comprises a grid structure; and
    (d) subsequently, depositing a second layer in one member of the group consisting of the same and another reactor.

2. The method according to claim 1, wherein the second layer is an aluminum-containing layer.

3. The method according to claim 1, wherein b) is performed outside the reactor used in a).

4. The method according to claim 1, wherein the partial pressure of oxygen inside the reactor while performing a), c), and d) is smaller than $5*10^{-6}$ Pa.

5. The method according to claim 4, wherein the partial pressure of oxygen while performing b) is greater than $5*10^{-6}$ Pa.

6. The method according to claim 1, wherein before performing d), the aluminum-free layer is structured such that partial areas of the aluminum-containing layer are exposed by the aluminum-free layer.

7. The method according to claim 1, wherein before performing d), the aluminum-free layer is structured such that the aluminum-containing layer is not exposed by the aluminum-free layer.

8. The method according to claim 1, wherein the mask layer is completely etched away before performing d).

9. The method according to claim 1, wherein the aluminum-free layer is completely etched away before performing d).

10. The method according to claim 1, wherein the second layer is aluminum-containing and wherein the aluminum content of said second layer in d) comprises a spatially inhomogeneous distribution of the aluminum concentration in a region above the surface structured in c).

11. The method according to claim 10, wherein in d), the layer comprises regions with a higher aluminum content, regions with a lower aluminum content, and above these a continuous region with a nominal aluminum content.

12. The method according to claim 1, wherein one member of the group consisting of gallium arsenide and gallium arsenide phosphide is used as the aluminum-free mask layer.

13. The method according to claim 11, wherein one member of the group consisting of gallium arsenide, gallium indium phosphide, and gallium arsenide phosphide is used as the aluminum-containing layer.

14. The method according to claim 1, wherein the aluminium-free layer comprises a compound semiconductor material that includes one element selected from the group consisting of indium, gallium, phosphorus, arsenic, antimony, and nitrogen.

* * * * *